(12) United States Patent
Peng et al.

(10) Patent No.: US 9,730,352 B2
(45) Date of Patent: Aug. 8, 2017

(54) CLAMP FOR PANEL-MOUNTED ELECTRONICS MODULES OR OTHER DEVICES

(71) Applicant: Honeywell International, Inc., Morristown, NJ (US)

(72) Inventors: Wen Peng, Shanghai (CN); Lei Jiang, Shanghai (CN); Chaohong Liu, Shanghai (CN); Qiankun Jiang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 253 days.

(21) Appl. No.: 14/469,379

(22) Filed: Aug. 26, 2014

(65) Prior Publication Data
US 2016/0066465 A1    Mar. 3, 2016

(51) Int. Cl.
| H05K 7/00 | (2006.01) |
| H05K 7/12 | (2006.01) |
| F16B 2/06 | (2006.01) |
| H02B 1/044 | (2006.01) |
| H05K 7/14 | (2006.01) |

(52) U.S. Cl.
CPC .............. *H05K 7/12* (2013.01); *F16B 2/065* (2013.01); *H02B 1/044* (2013.01); *H05K 7/1474* (2013.01)

(58) Field of Classification Search
USPC ................................................. 361/747, 710
See application file for complete search history.

(56) References Cited

U.S. PATENT DOCUMENTS

| 2,741,448 A | 4/1956 | Beckwith |
| 3,171,623 A | 3/1965 | Lawson et al. |
| 2011/0058336 A1* | 3/2011 | Sundstrom ........... H05K 7/1404 361/710 |

FOREIGN PATENT DOCUMENTS

| DE | 1261215 | 2/1968 |
| GB | 2167907 | 6/1986 |

OTHER PUBLICATIONS

European Search Report and Annex to the European Search Report issued for EP 15181309.4 dated Dec. 17, 2015, 7 pgs.
"Model UP150 Program Temperature Controller, User's Manual", Yokogawa, Feb. 2001, 1st Edition, 4 pages.
"Models UT130, UT150/UT152/UT155 Temperature Controllers, General Specifications", Yokogawa, Apr. 2, 2007, 4th Edition, 5 pages.

(Continued)

*Primary Examiner* — Andargie M Aychillhum

(57) ABSTRACT

A system includes (i) a module configured to be mounted on a panel and (ii) a clamp. The clamp includes a retaining section configured to receive and retain a threaded structure. The retaining section is also configured to be connected to and apply force against the module. The clamp also includes a contact section configured to contact the panel and apply force against the panel. The clamp further includes a connecting portion connecting the retaining section and the contact section. The connecting portion is configured to allow part of the threaded structure to contact the contact section in order to create the forces applied against the panel and the module. The connecting portion can be elastic such that a separation of the retaining section and the contact section changes as the threaded structure pushes against the contact section.

21 Claims, 8 Drawing Sheets

(56) References Cited

OTHER PUBLICATIONS

"P116, P108, P104 User Guide", Eurotherm, May 2012, 4 pages.
"ControlMaster CM10, CM30 and CM50 Universal process controllers, 1/8, 1/4 and 1/2 DIN, User Guide", ABB Limited, 2013, 8 pages.
"C50 1/16-DIN Process Controller Concise Product Manual-IM/C50", ABB Ltd., (No date), 2 pages.
"DCP301 Digital Program Controller User's Manual", Honeywell, Feb. 2004, 6 pages.

* cited by examiner

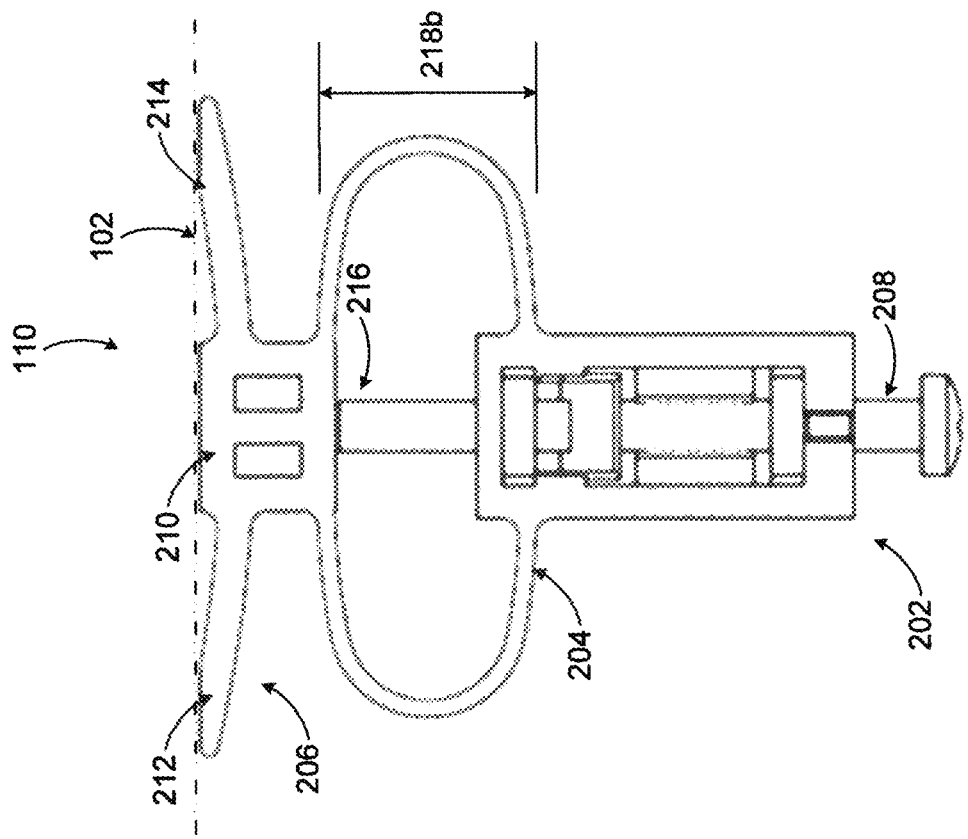
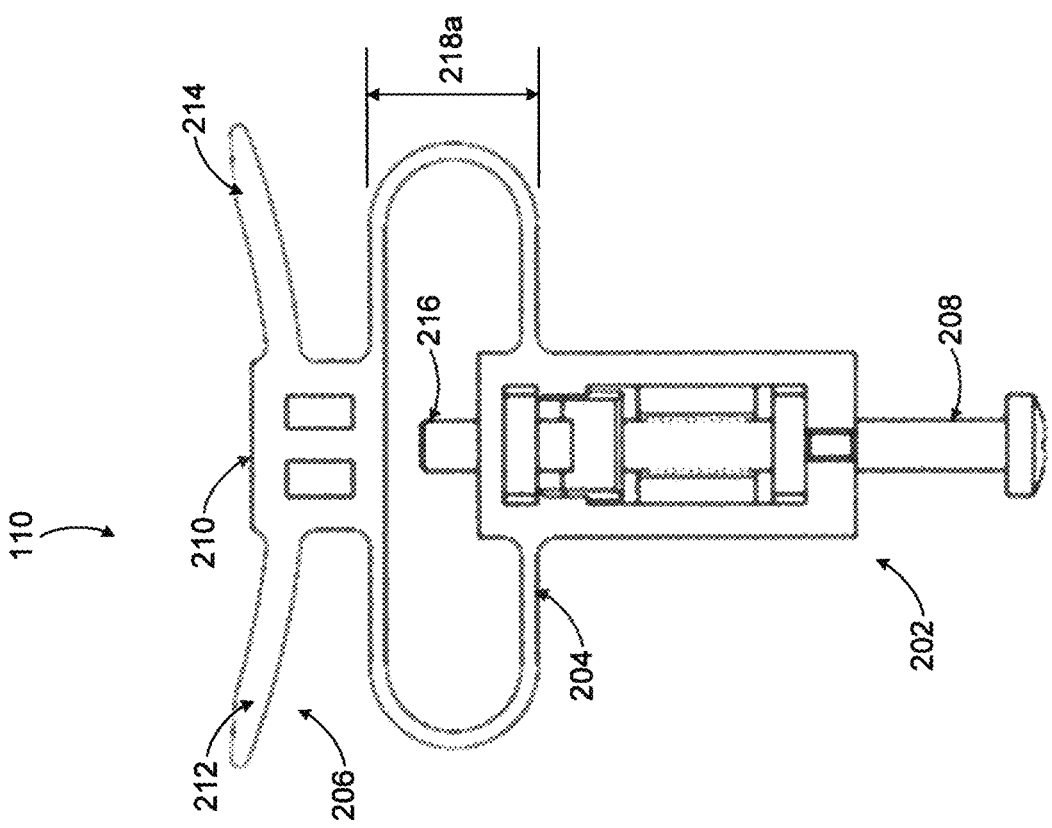

CLAMP FOR PANEL-MOUNTED ELECTRONICS MODULES OR OTHER DEVICES

TECHNICAL FIELD

This disclosure relates generally to mounting devices. More specifically, this disclosure relates to a clamp for panel-mounted electronics modules or other devices.

BACKGROUND

Various types of systems include one or more electronics modules that are mounted to a panel. The electronics modules could support a wide range of functions depending on the system. Often times, clamps are used to help mount the electronics modules to the panel. However, conventional clamps for mounting electronics modules often suffer from various drawbacks. For example, conventional clamps may not adequately secure an electronics module to a panel when used in an environment that undergoes a large amount of vibration. Also, conventional clamps may be complex or difficult to assemble or disassemble. In addition, conventional clamps may have a negative influence on the portions of the electronics modules and panel that connect to or contact the clamps.

SUMMARY

This disclosure provides a clamp for panel-mounted electronics modules or other devices and related system and method.

In a first embodiment, an apparatus includes a clamp configured to be connected to a module that is to be mounted on a panel. The clamp includes a retaining section configured to receive and retain a threaded structure. The retaining section is also configured to be connected to and apply force against the module. The clamp also includes a contact section configured to contact the panel and apply force against the panel. The clamp further includes a connecting portion connecting the retaining section and the contact section. The connecting portion is configured to allow part of the threaded structure to contact the contact section in order to create the forces applied against the panel and the module.

In a second embodiment, a system includes (i) a module configured to be mounted on a panel and (ii) a clamp. The clamp includes a retaining section configured to receive and retain a threaded structure. The retaining section is also configured to be connected to and apply force against the module. The clamp also includes a contact section configured to contact the panel and apply force against the panel. The clamp further includes a connecting portion connecting the retaining section and the contact section. The connecting portion is configured to allow part of the threaded structure to contact the contact section in order to create the forces applied against the panel and the module.

In a third embodiment, a method includes inserting a module through an opening of a panel, connecting at least one clamp to the module, and securely mounting the module to the panel using the at least one clamp. Each clamp includes a retaining section configured to receive and retain a threaded structure. The retaining section is also configured to be connected to and apply force against the module. Each clamp also includes a contact section configured to contact the panel and apply force against the panel. Each clamp further includes a connecting portion connecting the retaining section and the contact section. The connecting portion is configured to allow part of the threaded structure to contact the contact section in order to create the forces applied against the panel and the module.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 2A through 2C illustrate a first example clamp for panel-mounted electronics modules or other devices according to this disclosure;

DETAILED DESCRIPTION

FIGS. 1A through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
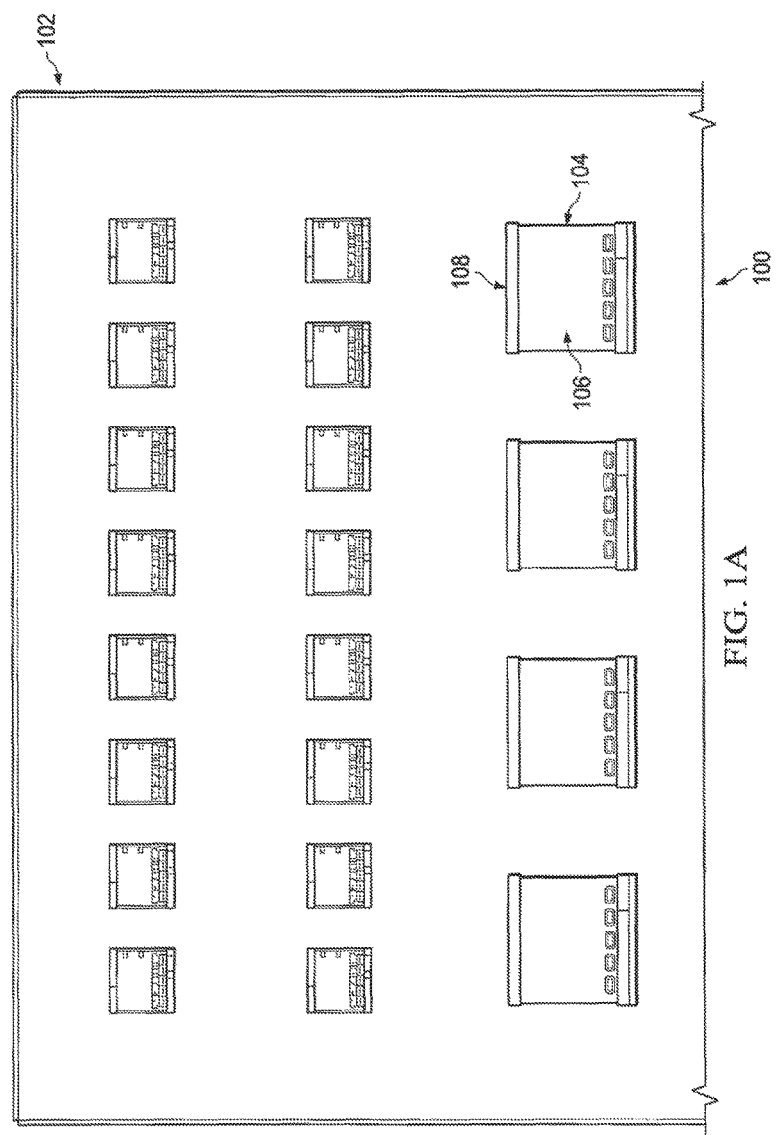
FIGS. 1A through 1C illustrate an example system using clamps for panel-mounted electronics modules or other devices according to this disclosure.
Figure 1B:
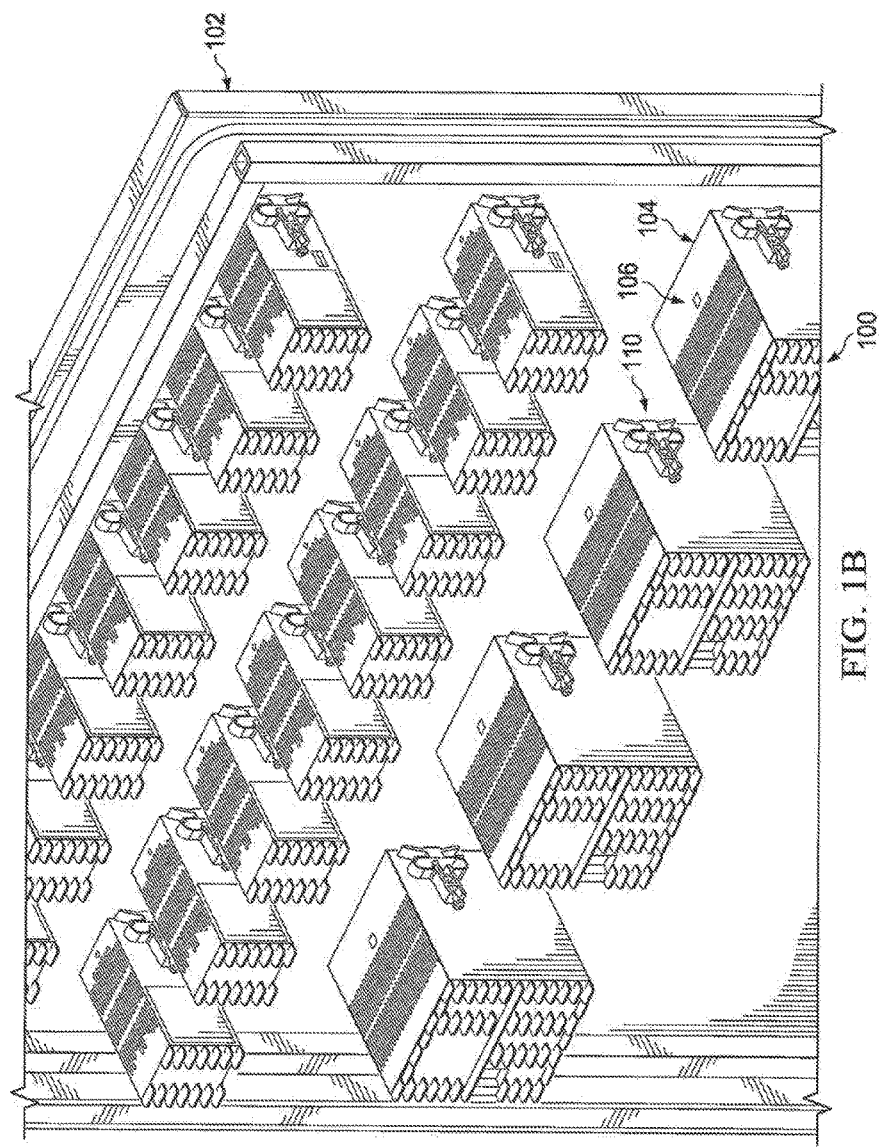
Figure 1C:
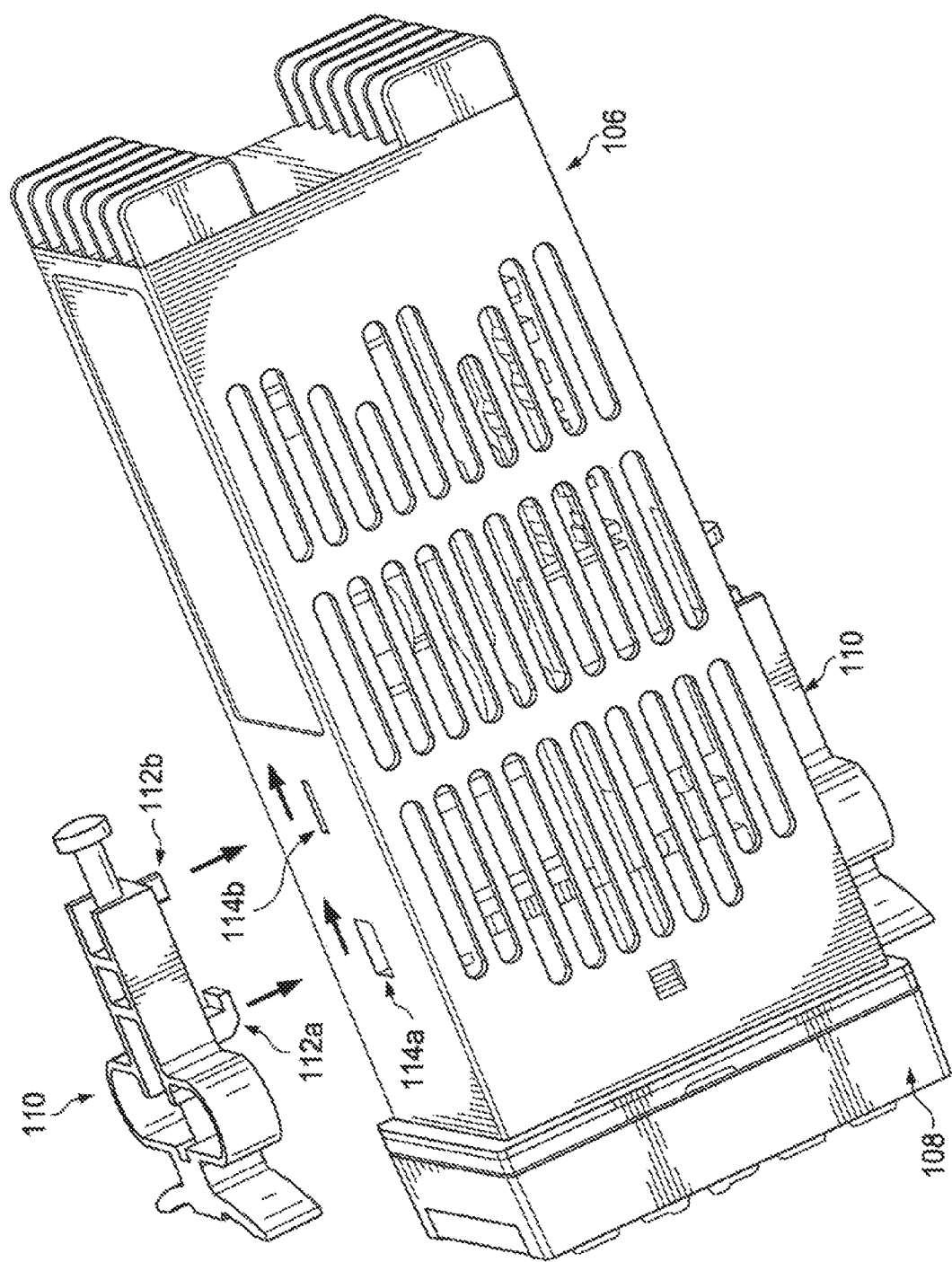

FIGS. 1A through 1C illustrate an example system 100 using clamps for panel-mounted electronics modules or other devices according to this disclosure. As shown in FIGS. 1A and 1B, the system 100 includes a panel 102 defining one or more openings 104. An electronics module 106 can be inserted into each opening 104 and mounted to the panel 102 as described in more detail below.

The panel 102 generally represents any suitable structure configured to receive and hold one or more electronics modules or other devices. The panel 102 could be formed from any suitable material(s), such as metal. The panel 102 could also be formed in any suitable manner, such as by machining. The panel 102 could represent an integrated structure or a structure formed from multiple components that are coupled together.

Each opening 104 could have any suitable size, shape, and dimensions. While openings 104 of two sizes are shown here, any number of sizes could be used for the openings 104. Also, each opening 104 could be formed in any suitable manner, such as by machining the material(s) forming the panel 102. In addition, the number and the arrangement of the openings 104 shown here are for illustration only. The panel 102 could include any suitable openings in any suitable arrangement.

As can be seen in FIGS. 1A and 1B, each electronics module 106 is inserted through its associated opening 104. In this example, the back of each electronics module 106 can be inserted through its associated opening 104, and a wider bracket 108 at the front of that electronics module 106 contacts the panel 102. Also, one or more clamps 110 are coupled to each electronics module 106, and each clamp 110 applies a force against the panel 102 and the associated electronics module 106. The clamps 110 therefore help to secure the electronics modules 106 in their openings 104, thereby helping to securely mount the electronics modules 106 to the panel 102. Each electronics module 106 could be coupled to a single clamp 110 or to multiple claims 110. In some embodiments, two clamps 110 positioned on opposing sides of each electronics module 106 are used to securely mount that electronics module 106 to the panel 102.

Each bracket 108 includes any suitable structure in an electronics module that is wider than an opening into which the electronics module is to be inserted. Each bracket 108 could, for example, represent a front cover attached to a narrower frame of an electronics module or a portion of the frame in an electronics module that is wider than other portions of the frame.

As shown in FIG. 1C, a clamp 110 can be removably attached to an associated electronics module 106. The clamp 110 here includes two projections 112a-112b, which can engage with two openings 114a-114b of an electronics module 106. In this example, the projection 112a is larger than the projection 112b, and the opening 114a is larger than the opening 114b. Also, the projection 112a forms a hook-type structure that locks onto part of the electronics module 106, while the projection 112b represents a simple extension. These characteristics are for illustration only, and the projections 112a-112b and the openings 114a-114b could have any other suitable forms. For instance, both projections 112a-112b could form hook-type structures that lock onto parts of the electronics module 106.

The clamp 110 is coupled to the electronics module 106 by inserting the projections 112a-112b into the openings 114a-114b and then pushing the clamp 110 towards the back of the electronics module 106. This secures the projection 112a onto the electronics module 106, while the projection 112b helps to ensure that the clamp 110 only moves linearly on the electronics module 106 and cannot rotate significantly. The clamp 110 can be removed from the electronics module 106 by pushing the clamp 110 towards the front of the electronics module 106 and removing the projections 112a-112b from the openings 114a-114b.

As described in more detail below, the clamp 110 is designed to translate a screw force provided on one side of the clamp 110 into a force applied at the opposite side of the clamp 110. This causes a contact section of the clamp 110 to push against the panel 102 in one direction, while the projections 112a-112b of the clamp 110 push against the electronics module 106 in the opposite direction. In this manner, the clamp 110 can be used to securely mount the electronics module 106 to the panel 102. The phrase "screw force" is used in this patent document to refer to any substantially linear force that is created by rotating a threaded structure, whether the threaded structure represents a screw, bolt, or other device.

Each clamp 110 can be formed from any suitable material(s). In some embodiments, at least a portion of the clamp 110 can be formed using a plastic or other elastic material. In particular embodiments, the entire clamp 110 can be formed using a plastic or other elastic material. In other embodiments, the clamp 110 can be formed as a multi-piece assembly, which may or may not include a plastic or other elastic material. Each clamp 110 can also be formed in any suitable manner, such as by using injection molding or machining.

Although FIGS. 1A through 1C illustrate one example of a system 100 using clamps 110 for panel-mounted electronics modules 106 or other devices, various changes may be made to FIGS. 1A through 1C. For example, while described as being used with electronics modules 106 and a panel 102, the clamps 110 could be used to securely mount any suitable components to a panel. Also, FIGS. 1A through 1C illustrate one example environment in which one or more clamps 110 can be used to securely mount modules. Modules containing any suitable components could be mounted to any suitable structures using the clamps 110.

Figure 2A:
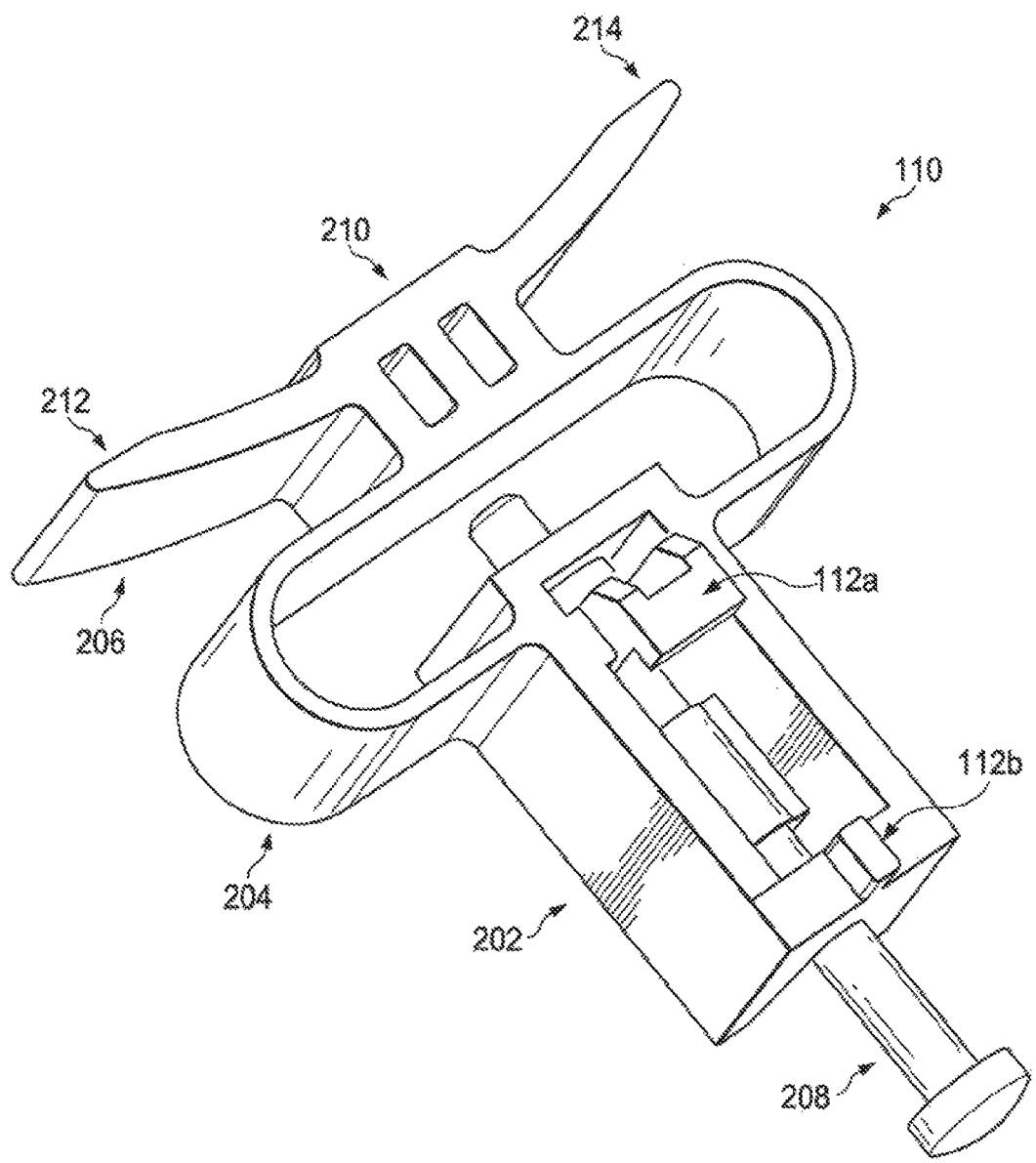

FIGS. 2A through 2C illustrate a first example clamp 110 for panel-mounted electronics modules or other devices according to this disclosure. For ease of explanation, the clamp 110 shown in FIGS. 2A through 2C is described as being used in the system 100 of FIGS. 1A through 1C. However, the clamp 110 could be used in any other suitable system.

As shown in FIG. 2A, the clamp 110 generally includes a body having a retaining section 202, a connecting portion 204, and a contact section 206. These components 202-206 could form an integrated body or be fabricated separately and then connected to one another.

The retaining section 202 denotes the portion of the body used to retain a screw 208 or other threaded structure. For example, the retaining section 202 could include one or more threaded sections that mate with threads of the screw 208, or the retaining section 202 could receive and retain one or more nuts having threaded sections that mate with threads of the screw 208. The retaining section 202 represents any suitable structure configured to receive and retain a threaded structure. While the use of a screw is described here, any other threaded structure that can be rotated to create a screw force may be used (such as a bolt). As shown here, the projections 112a-112b can form part of the retaining section 202.

The connecting portion 204 couples the retaining section 202 and the contact section 206. The connecting portion 204 generally holds the contact section 206 in position with respect to the retaining section 202. As described in more detail below, the screw 208 can be extended through the open central portion of the connecting portion 204 in order to physically contact the contact section 206. The connecting portion 204 may also be at least partially elastic so that the distance between the retaining section 202 and the contact section 206 can vary. The connecting portion 204 includes any suitable portion of the body that physically connects a retaining section and a contact section. In this example, the connecting portion 204 represents a loop that is generally elliptical in shape, although the connecting portion 204 could have any other suitable form.

The contact section 206 represents the portion of the clamp 110 that physically contacts and pushes against the panel 102. In this example, the contact section 206 represents a multi-point contact that is designed to apply forces against the panel 102 at multiple locations that are separated from one another. More specifically, the contact section 206 here represents a three-point contact that has a generally "tee" shape with a raised central portion 210 and two arms 212-214 extending from the central portion 210. The arms 212-214 are deformable in that they can be depressed downward towards the connecting portion 204 and the retaining section 202. This contact section 206 is designed so that the raised central portion 210 and outer tips of the arms 212-214 contact and push against the panel 102 during operation of the clamp 110. The outer tips of the arms 212-214 could be flattened to support this functionality. Note that while the contact section 206 is shown here as representing a three-point contact, the contact section 206 could support any number of contact points. Moreover, the contact section 206 could be designed to apply a force against the panel 102 across the entire width of the contact section 206.

The amount of force applied against the panel 102 by the clamp 110 depends upon the extent to which the screw 208 contacts and pushes against the contact section 206. Example operation of the clamp 110 is shown in more detail in FIGS. 2B and 2C. In FIG. 2B, the screw 208 is positioned so that a blunted tip 216 of the screw 208 is spaced apart from and applying no pressure against the contact section 206. As a result, the connecting portion 204 can have a minimum height 218a as shown in FIG. 2B, and the retaining section 202 and the contact section 206 have a minimum separation. Also, the arms 212-214 of the contact section 206 can extend above the raised central portion 210 of the contact section 206.

In FIG. 2C, the screw 208 has been rotated so that it is now in a position where its tip 216 pushes against and moves the contact section 206 outward. This increases the height 218b of the connecting portion 204 and pushes the contact section 206 away from the retaining section 202, increasing the separation between the retaining section 202 and the contact section 206. Forcing the contact section 206 against the panel 102 causes the arms 212-214 of the contact section 206 to be depressed, allowing both the tips of the arms 212-214 and the central portion 210 to contact the panel 102. This therefore causes the contact section 206 of the clamp 110 to apply force against the panel 102. At the same time, because the retaining section 202 is secured to the electronics module 106 via the projections 112a-112b, this also causes the clamp 110 to apply force against the electronics module 106 in the opposite direction. Effectively, the clamp 110 pulls the wider bracket 108 of the electronics module 106 against the panel 102, helping to securely mount the electronics module 106 to the panel 102 within its opening 104.

During operation in this manner, the screw force from the screw 208 is translated into force against the panel 102. For example, a screw force can be applied against the panel 102 at the raised central portion 210 of the contact section 206, and contact forces can be applied against the panel 102 by the deformed arms 212-214 of the contact section 206. The clamp 110 therefore provides a tight and secure connection that is more stable compared to conventional clamps, even in environments that undergo large amounts of vibration. Also, the amount of force applied against the panel 102 by the clamp 110 can be easily varied simply by turning the screw 208, and the clamp 110 can be easily assembled and disassembled. In addition, rather than contacting the panel 102 using the screw 208 (which is small and typically sharp), the force applied against the panel 102 by the contact section 206 can be distributed over the much-larger surface of the contact section 206. As a result, the clamp 110 can more effectively protect the panel 102 and the electronics module 106 from damage.

Figure 3:
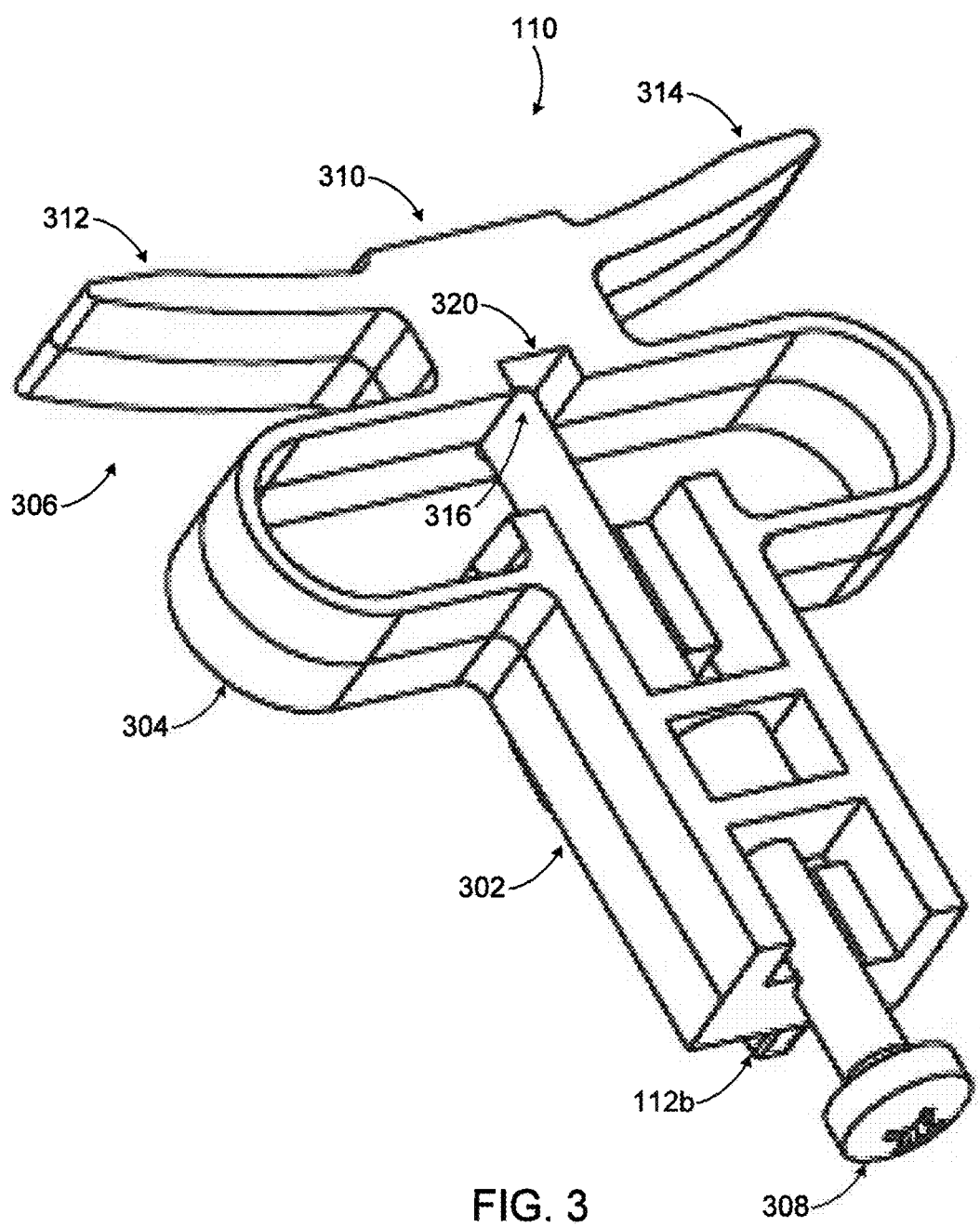
FIG. 3 illustrates a second example clamp for panel-mounted electronics modules or other devices according to this disclosure.

FIG. 3 illustrates a second example clamp 110 for panel-mounted electronics modules or other devices according to this disclosure. For ease of explanation, the clamp 110 shown in FIG. 3 is described as being used in the system 100 of FIGS. 1A through 1C. However, the clamp 110 could be used in any other suitable system.

As shown in FIG. 3, the clamp 110 in FIG. 3 is similar to the clamp shown in FIGS. 2A through 2C. The clamp 110 in FIG. 3 includes a retaining section 302, a connecting portion 304, and a contact section 306. The retaining section 302 denotes the portion of a body used to retain a screw 308 or other threaded structure. The contact section 306 represents a three-point contact with a raised central portion 310 and two extended arms 312-314. These components 302-314 can be the same as or similar to the corresponding components 202-214 described above.

The clamp 110 in FIG. 3 additionally includes a groove 320 in the contact section 306. The groove 320 is configured to receive a tip 316 of the screw 308 and helps to prevent slippage of the tip 316 out of the contact section 306. In this example, the groove 320 extends partially across the inner surface of the contact section 306, although it could have other forms (such as a circular groove or a groove that extends completely across the inner surface of the contact section 306). Also, the inner surface of the groove 320 could be slanted towards a center of the contact section 306 to help keep the tip 316 of the screw 308 centered in the contact section 306. The groove 320 could have any suitable size, shape, and dimensions. The groove 320 could also be formed in any suitable manner.

Figure 4A:
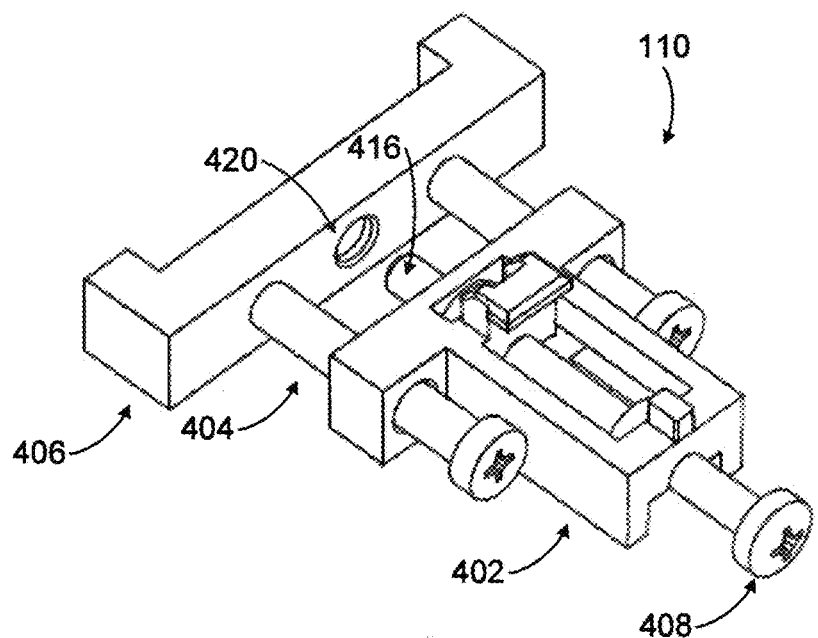
FIGS. 4A and 4B illustrate a third example clamp for panel-mounted electronics modules or other devices according to this disclosure.
Figure 4B:
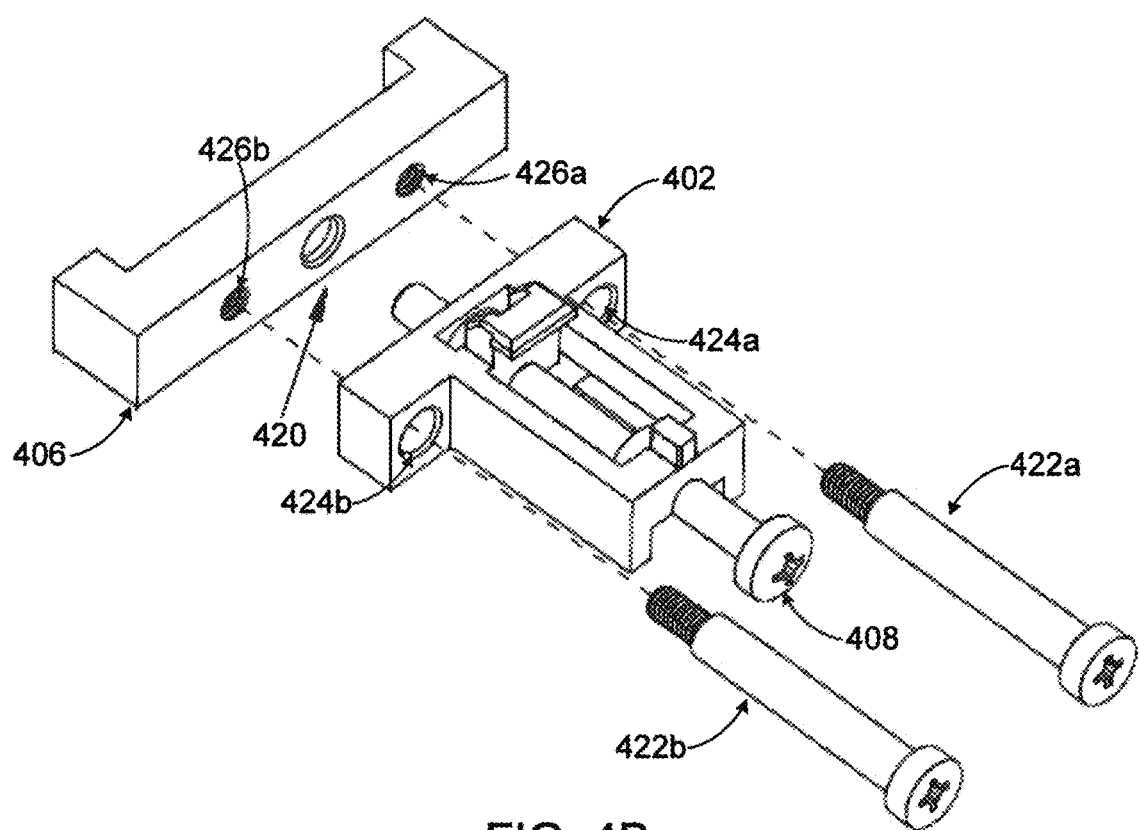

FIGS. 4A and 4B illustrate a third example clamp 110 for panel-mounted electronics modules or other devices according to this disclosure. For ease of explanation, the clamp 110 shown in FIGS. 4A and 4B is described as being used in the system 100 of FIGS. 1A through 1C. However, the clamp 110 could be used in any other suitable system.

As shown in FIG. 4A, the clamp 110 includes a retaining section 402, a connecting portion 404, and a contact section 406. The retaining section 402 denotes the portion of the clamp 110 used to retain a screw 408 or other threaded structure. The contact section 406 represents a two-point contact that contacts the panel 102 at ends of the contact section 406. Note, however, that other forms of the contact section could be used, such as the three-point contact described above. The screw 408 can be rotated to vary the separation between the retaining section 402 and the contact section 406 in the manner as described above. The contact section 406 also includes a groove 420, which is configured to receive a tip 416 of the screw 408. In this example, the groove 420 represents a generally circular groove, although other forms of the groove 420 could be used.

The retaining section 402 and the contact section 406 denote multiple pieces of the clamp 110 that are connected using the connecting portion 404. As shown in FIG. 4B, in this example, the connecting portion 404 is implemented using two bolts 422a-422b. The bolts 422a-422b are inserted through openings 424a-424b of the retaining section 402, and threaded ends of the bolts 422a-422b mate with threaded receptacles 426a-426b of the contact section 406. The bolts 422a-422b therefore allow the separation between the retaining section 402 and the contact section 406 to vary up to a maximum separation, which is defined as the location where the heads of the bolts 422a-422b stop the movement of the retaining section 402 away from the contact section 406. Note, however, that this form of the connecting portion 404 is for illustration only and that other mechanisms could be used to connect the retaining section 402 and the contact section 406 while allowing the separation between those sections to vary.

Although FIGS. 2A through 4B illustrate examples of clamps 110 for panel-mounted electronics modules 106 or other devices, various changes may be made to FIGS. 2A through 4B. For example, the surface features of the clamps 110 could vary according to particular needs. Also, any combination of features shown in these figures could be used in a clamp 110, such as when features shown in one or more of these figures are combined with features shown in one or more others of these figures.

Figure 5:
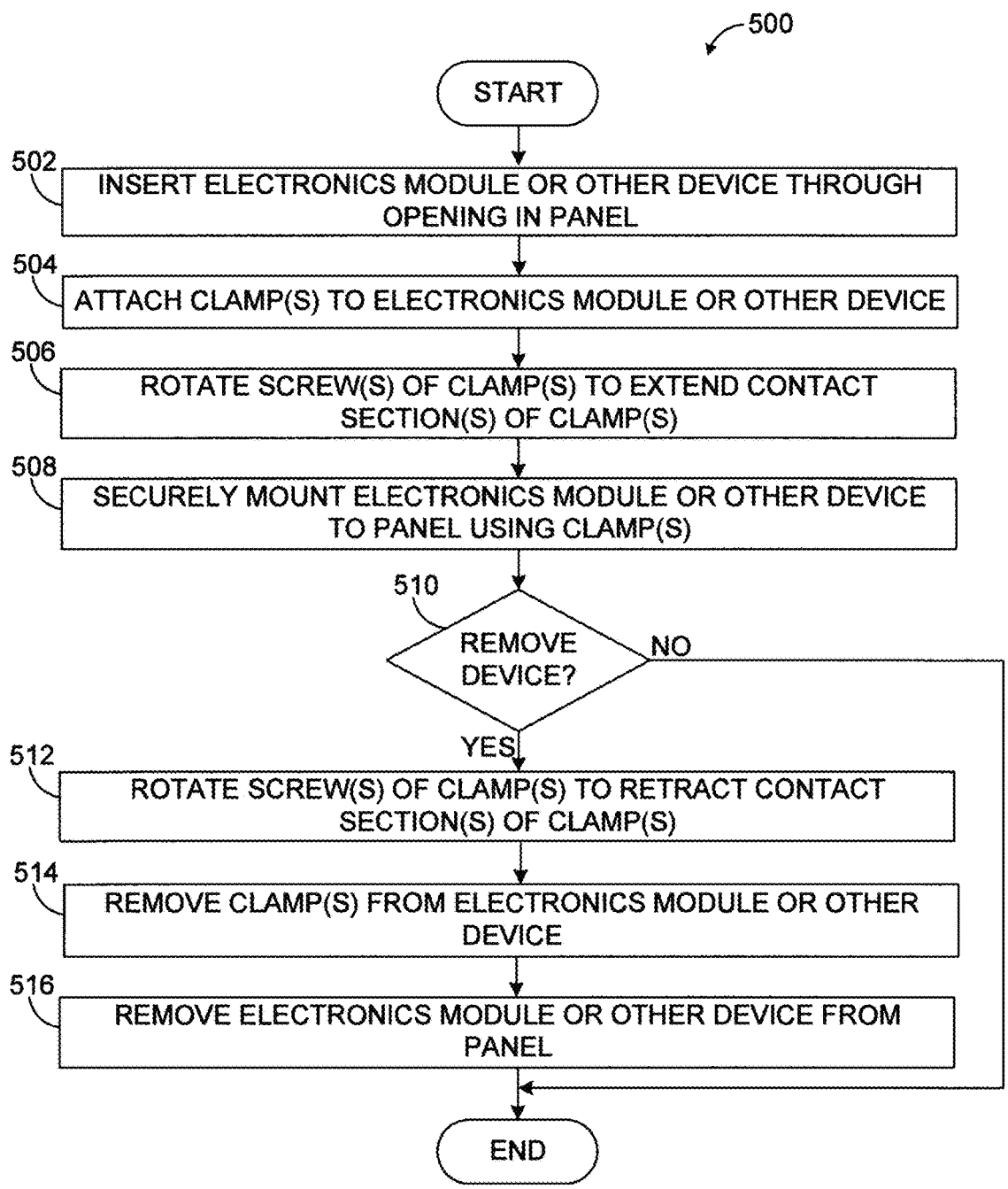
FIG. 5 illustrates an example method for mounting an electronics module or other device to a panel using at least one clamp according to this disclosure.

FIG. 5 illustrates an example method 500 for mounting an electronics module or other device to a panel using at least one clamp according to this disclosure. For ease of explanation, the method 500 is described with respect to the clamps 110 shown in FIGS. 2A through 4B being used in the system 100 of FIGS. 1A through 1C. The method 500 could be used with any other suitable clamp and in any other suitable system.

As shown in FIG. 5, an electronics module or other device is inserted through an opening in a panel at step 502. This could include, for example, personnel inserting an electronics module 106 through an opening 104 in a panel 102. The back of the electronics module 106 could be inserted through the opening 104 until a wider bracket 108 at the front of the electronics module 106 contacts the panel 102, although any suitable installation configuration could be used.

One or more clamps are attached to the electronics module or other device at step 504. This could include, for example, the personnel inserting the projections 112a-112b of one or more clamps 110 into corresponding openings 114a-114b of the electronics module 106. This could also include the personnel pushing the clamp(s) 110 towards a rear of the electronics module 106 to latch the projection 112a of each clamp 110 onto the electronics module 106.

A screw or other threaded structure of each clamp is rotated to extend the contact section of that clamp at step 506, and the electronics module or other device is securely mounted to the panel using the clamp(s) at step 508. This could include, for example, the personnel using a screwdriver to rotate the screw 208, 308, 408 of each clamp 110 until that screw 208, 308, 408 contacts and pushes against the contact section 206, 306, 406 of that clamp 110. This could also include each contact section 206, 306, 406 applying force against the panel 102 in one direction and the clamp 110 applying force against the electronics module 106 in the opposite direction. The personnel could tighten the screw(s) 208, 308, 408 of the clamp(s) 110 in order to securely mount the electronics module 106 to the panel 102.

The electronics module or other device could be used until a decision is made to remove the device at step 510. In response to that decision, the screw or other threaded structure of each clamp is rotated to retract the contact section of each clamp at step 512. This could include, for example, the personnel using the screwdriver to rotate the screw 208, 308, 408 of each clamp 110 until the contact section 206, 306, 406 of that clamp 110 moves an adequate distance from the panel 102. The one or more clamps are removed from the electronics module or other device at step 514, and the electronics module or other device is removed from the panel at step 516.

As can be seen here, the use of the clamp(s) 110 allows electronics modules 106 or other devices to be quickly and easily mounted to a panel 102. The clamps 110 also provide for more secure mounting compared to conventional devices, including in environments that undergo large amounts of vibration.

Although FIG. 5 illustrates one example of a method 500 for mounting an electronics module 106 or other device to a panel 102 using at least one clamp 110, various changes may be made to FIG. 5. For example, while shown as a series of steps, various steps in FIG. 5 could overlap, occur in parallel, occur in a different order, or occur multiple times.

Also, as noted above, any suitable threaded structure could be used in place of a screw in a clamp, such as a bolt that is rotated using a ratchet.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a clamp configured to be connected to a module that is to be mounted on a panel, the clamp comprising:
a contact section configured to contact the panel and apply a first force against the panel;
a retaining section configured to receive and retain a threaded structure that is configured to apply a force against the contact section to thereby generate the first force against the panel and an opposing second force against the module; and
a connecting portion connecting the retaining section and the contact section, the connecting portion configured to allow part of the threaded structure to pass through the retaining section to the contact section and contact the contact section in order to create the forces applied against the panel and the module.

2. The apparatus of claim 1, wherein:
the clamp further comprises a screw forming the threaded structure; and
a tip of the screw is configured to contact the contact section.

3. The apparatus of claim 1, wherein the clamp is configured to translate a screw force created using the threaded structure into the first force against the panel and the second force against the module.

4. The apparatus of claim 1, wherein the contact section comprises a multi-point contact configured to contact the panel at multiple separated locations.

5. The apparatus of claim 1, wherein the contact section comprises a groove configured to receive a tip of the threaded structure.

6. The apparatus of claim 1, wherein the connecting portion is elastic such that a separation of the retaining section and the contact section changes as the threaded structure pushes against the contact section.

7. The apparatus of claim 1, wherein:
the retaining section and the contact section comprise separate pieces of the clamp; and the connecting portion is configured to allow a separation of the retaining section and the contact section to vary.

8. The apparatus of claim 1, wherein the clamp further comprises:
at least one projection projecting from the retaining section, the at least one projection configured to be connected to the module and to apply the second force against the module.

9. A system comprising:
a module configured to be mounted on a panel; and
a clamp comprising:
a contact section configured to contact the panel and apply a first force against the panel;
a retaining section configured to receive and retain a threaded structure that is configured to apply a force against the contact section to thereby generate the first force against the panel and an opposing second force against the module; and
a connecting portion connecting the retaining section and the contact section, the connecting portion configured to allow part of the threaded structure to pass through the retaining section to the contact section and contact the contact section in order to create the forces applied against the panel and the module.

10. The system of claim 9, wherein:
the clamp further comprises a screw forming the threaded structure; and
a tip of the screw is configured to contact the contact section.

11. The system of claim 9, wherein the contact section comprises a multi-point contact configured to contact the panel at multiple separated locations.

12. The system of claim 9, wherein the contact section comprises a groove configured to receive a tip of the threaded structure.

13. The system of claim 9, wherein the connecting portion is elastic such that a separation of the retaining section and the contact section changes as the threaded structure pushes against the contact section.

14. The system of claim 9, wherein:
the retaining section and the contact section comprise separate pieces of the clamp; and
the connecting portion is configured to allow a separation of the retaining section and the contact section to vary.

15. The system of claim 9, wherein the clamp further comprises:
at least one projection projecting from the retaining section, the at least one projection configured to be connected to the module and to apply the second force against the module.

16. The system of claim 9, wherein:
the module comprises a front portion that is larger than an opening in the panel; and
the clamp is configured to apply the forces in order to hold the front portion of the module against the panel.

17. The system of claim 9, wherein the clamp comprises one of multiple clamps that are configured to securely mount the module to the panel.

18. A method comprising:
inserting a module through an opening of a panel;
connecting at least one clamp to the module; and
securely mounting the module to the panel using the at least one clamp;
wherein each clamp comprises:
a contact section configured to contact the panel and apply a first force against the panel;
a retaining section configured to receive and retain a threaded structure that is configured to apply a force against the contact section to thereby generate the first force against the panel and an opposing second force against the module; and
a connecting portion connecting the retaining section and the contact section, the connecting portion configured to allow part of the threaded structure to pass through the retaining section to the contact section and contact the contact section in order to create the forces applied against the panel and the module.

19. The method of claim 18, wherein securely mounting the module to the panel comprises:
rotating the threaded structure of each clamp to increase a separation between the retaining section and the contact section in order to apply the forces to the panel and the module.

20. The method of claim 18, further comprising:
removing the at least one clamp from the module; and
removing the module from the opening of the panel.

21. The method of claim 20, wherein removing the at least one clamp from the module comprises rotating the threaded structure of each clamp to decrease a separation between the retaining section and the contact section in order to allow at least one projection of each clamp to be removed from a corresponding opening of the module.

* * * * *